(12) United States Patent
Hayashi et al.

(10) Patent No.: US 11,217,421 B2
(45) Date of Patent: Jan. 4, 2022

(54) ADJUSTMENT METHOD AND ELECTRON BEAM DEVICE

(71) Applicant: EBARA CORPORATION, Tokyo (JP)

(72) Inventors: Takehide Hayashi, Tokyo (JP); Ryo Tajima, Tokyo (JP); Tatsuya Kohama, Tokyo (JP); Kenji Watanabe, Tokyo (JP); Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/879,151

(22) Filed: May 20, 2020

(65) Prior Publication Data

US 2021/0012997 A1 Jan. 14, 2021

(30) Foreign Application Priority Data

Jul. 12, 2019 (JP) ............................. JP2019-129715

(51) Int. Cl.
*H01J 37/147* (2006.01)
*H01J 37/244* (2006.01)
*H01J 37/32* (2006.01)
*H01J 37/14* (2006.01)

(52) U.S. Cl.
CPC .......... *H01J 37/1471* (2013.01); *H01J 37/14* (2013.01); *H01J 37/244* (2013.01); *H01J 37/32568* (2013.01); *H01J 2237/1501* (2013.01); *H01J 2237/24564* (2013.01)

(58) Field of Classification Search
CPC .................................................. H01J 37/1471
See application file for complete search history.

(56) References Cited

U.S. PATENT DOCUMENTS

| 2006/0169895 A1* | 8/2006 | Honda | ..................... H01J 37/28 250/310 |
| 2012/0074317 A1* | 3/2012 | Diemer | ................... H01J 37/28 250/307 |
| 2014/0107958 A1* | 4/2014 | Hayashi | ............... G01B 21/042 702/95 |

FOREIGN PATENT DOCUMENTS

| JP | 2011/054426 A | * | 3/2011 | ............ H01J 37/147 |
| JP | 2016-035800 A | | 3/2016 | |

OTHER PUBLICATIONS

Ura, Katsumi., "Electronic and Ion Beam Optics", Kyoritsu Shuppan Co., Ltd., Aug. 1994, partial translation, p. 6, 9 and 10.

\* cited by examiner

*Primary Examiner* — Eliza W Osenbaugh-Stewart (74) *Attorney, Agent, or Firm* — Pearne & Gordon LLP (57) ABSTRACT

An adjustment method for adjusting a path of an electron beam passing through an electron beam device including at least one unit having at least one lens and at least one aligner electrode, and a detector configured to detect the electron beam, the method including: a step of measuring, by a coordinate measuring machine, an assembly tolerance for each of a plurality of the units constituting the electron beam device; a step of determining a shift amount of the electron beam at a position of the at least one of the lenses; a step of determining an electrode condition for each of a plurality of the aligner electrodes included in the units in a manner such that a shift amount of the electron beam is to be the determined shift amount; and a step of setting each of the aligner electrodes to the corresponding determined electrode condition.

5 Claims, 8 Drawing Sheets

ADJUSTMENT METHOD AND ELECTRON BEAM DEVICE

CROSS-REFERENCE TO RELATED APPLICATION

This application claims the benefit of Japanese Priority Patent Application JP 2019-129715 filed on Jul. 12, 2019, the entire contents of which are incorporated herein by reference.

FIELD

The present technology relates to an adjustment method and an electron beam device for adjusting a path of an electron beam.

BACKGROUND AND SUMMARY

<Constituent Parts of Optical System using Electron Beam and Permissible Values for their Arrangement>

In an electron beam device that irradiates an object with an electron beam (for example, an electron microscope or a device for inspecting an object with an electron beam), constituent parts of an optical system, such as a magnetic field lens, an electrostatic lens, a Wien filter, and a scan electrode, are arranged and used. If the constituent parts (for example, a magnetic lens or an electrostatic lens) are misaligned from the electron beam, components of aberration or the like increase, and which leads to image distortion and blurring. The permissible axial accuracy of the lens with respect to the electron beam is several μm.

<Mechanical Structure of Optical System using Electron Beam>

In order to generate and use an electron beam, the path of the electron beam needs to be a vacuum. Thus, the path of the electron beam has to be a space separated from the atmospheric pressure, and the path of the electron beam is normally prepared inside a metal chamber. This is achieved by evacuation of the inside of the chamber by an evacuation device.

The shapes of constituent devices used to operate the electron source and the electron beam are assumed to be the same as the shape of the inside of the metal chamber, and the sizes of the shapes are assumed to be the same. Here, if the center of the outer circumference and the center of the inner circumference of each constituent device are the same, all the axial shifts are 0 mm in the above configuration.

Here, the constituent devices are made by machining various materials. Since the constituent devices are made by machining various materials, the machining accuracy affects the axial center accuracy. Tolerance dimensions in normal machining are from several tens μm to several hundreds μm. Thus, an axial shift is caused by the machining accuracy of each constituent device, and this cannot be kept within several μm.

To solve this problem, it is conceivable to arrange an aligner electrode to correct the axial shift. At this time, by arranging a plurality of aligner electrodes in front of the constituent parts, it is possible to adjust the incident angles with respect to the constituent parts.

As a correction for the axial shift of an electron beam, for example, JP 2016-35800 A discloses that an electric axis adjustment is performed after a mechanical axis adjustment, and this processing is repeated.

<Assembly Structure of Optical System using Electron Beam>

Meanwhile, when a large number of elements of the optical system are assembled, cooling fit, shrink fit, and clearance fit are performed so that the axis accuracy is maintained to some extent. The reason for these is that the degree of position correction by an aligner electrode is restricted by the size of the electrode and the amounts of voltage and current applied to the electrode, and the device can be huge for the aligner to absorb all manufacturing errors.

(1) First method used for unit assembly structure (method using cooling fit and shrink fit)

A unit is fitted by cooling the internal structure to be shrunk or by burning the external structure to be expanded.

(2) Second method used for unit assembly structure (method using clearance fit)

A unit is fitted into the gap between units to be coupled.

(3) Third method used for unit assembly structure (using a positioning pin in clearance fit)

A unit is fitted by fitting a positioning pin into the gap between units to be coupled when fitted into the groove of the unit to be coupled.

As described above, the shift of parts due to the tolerance generated during machining is reduced as much as possible by cooling fit, shrink fit, and clearance tolerances during assembly, and by using positioning pins and the like, but the shift that is not absorbed by them can be absorbed by performing the optical axis adjustment using aligner electrodes.

Here, to correct the shift of the optical axis of an electron beam using aligner electrodes, the voltage of each aligner electrode needs to be adjusted so that the incidence position of the electron beam on a detector or the position of an image (also referred to as a spot) of the electron beam imaged by the detector is not changed although the conditions of lens are changed. However, this adjustment has been difficult and time-consuming.

It is desired to provide an adjustment method and an electron beam device capable of facilitating adjustment of the shift of the optical axis of an electron beam in the electron beam device.

An adjustment method according to one embodiment for adjusting a path of an electron beam passing through an electron beam device including at least one unit having at least one lens and at least one aligner electrode, and a detector configured to detect the electron beam, the method comprising: a step of measuring, by a coordinate measuring machine, an assembly tolerance for each of a plurality of the units constituting the electron beam device; a step of determining, in consideration of the assembly tolerance for each of the units in a manner such that the electron beam passes through the center of at least one of a plurality of the lenses, a shift amount of the electron beam at a position of the at least one of the lenses; a step of determining an electrode condition for each of a plurality of the aligner electrodes included in the units in a manner such that a shift amount of the electron beam is to be the determined shift amount; and a step of setting each of the aligner electrodes to the corresponding determined electrode condition.

An electron beam device according to one embodiment comprising: at least one unit having at least one lens and at least one aligner electrode; a detector configured to detect an electron beam; and a controller configured to perform control to determine, in consideration of an assembly tolerance, the assembly tolerance measured by a coordinate measuring machine, for each of a plurality of the units constituting the electron beam device, in a manner such that the electron beam passes through the center of at least one of a plurality of the lenses, a shift amount of the electron beam at a position of the at least one of the lenses, to determine an electrode condition for each of a plurality of the aligner electrodes included in the units in a manner such that a shift amount of the electron beam is to be the determined shift amount, and to set each of the aligner electrodes to the corresponding determined electrode condition.

DETAILED DESCRIPTION

In the following, embodiments will be described with reference to the drawings. However, unnecessarily detailed descriptions can be omitted. For example, detailed descriptions of well-known facts or redundant descriptions of substantially the same configurations can be omitted. This is to prevent the following description from being unnecessarily redundant and to facilitate understanding by those skilled in the art.

An adjustment method according to one embodiment for adjusting a path of an electron beam passing through an electron beam device including at least one unit having at least one lens and at least one aligner electrode, and a detector configured to detect the electron beam, the method comprising: a step of measuring, by a coordinate measuring machine, an assembly tolerance for each of a plurality of the units constituting the electron beam device; a step of determining, in consideration of the assembly tolerance for each of the units in a manner such that the electron beam passes through the center of at least one of a plurality of the lenses, a shift amount of the electron beam at a position of the at least one of the lenses; a step of determining an electrode condition for each of a plurality of the aligner electrodes included in the units in a manner such that a shift amount of the electron beam is to be the determined shift amount; and a step of setting each of the aligner electrodes to the corresponding determined electrode condition.

With this configuration, the electrode conditions of the aligner electrodes are mostly adjusted by determining the electrode condition for each of the aligner electrodes included in the units in a manner such that a path of the electron beam is to be the simulated path, and fine manual adjustment is only required. Thus, it is possible to facilitate the adjustment of the optical axis shift of the electron beam in the electron beam device.

Here, the adjustment method may further comprise a step of adjusting, after the setting each of the aligner electrodes to the corresponding determined electrode condition, the corresponding electrode condition for each of the aligner electrodes in a manner such that an image of the electron beam obtained by the detector is not changed although a condition for each of the lenses is changed.

Here, when the aligner electrode is an electric field aligner, a correspondence relation between the shift amount of the electron beam at the position of the at least one of the lenses and a voltage between electrodes of the aligner electrode may be predetermined, and in the step of determining the electrode condition, by applying the shift amount of the electron beam at the position of the lens to the correspondence relation, the voltage between the electrodes of the aligner electrode may be determined as the electrode condition.

Or, when the aligner electrode is a magnetic field aligner, a correspondence relation between the shift amount of the electron beam at the position of the at least one of the lenses and a current applied to the aligner electrode may be predetermined, and in the step of determining the electrode condition, by applying the shift amount of the electron beam at the position of the lens to the correspondence relation, the current applied to the aligner electrode may be determined as the electrode condition.

An electron beam device according to one embodiment comprising: at least one unit having at least one lens and at least one aligner electrode; a detector configured to detect an electron beam; and a controller configured to perform control to determine, in consideration of an assembly tolerance, the assembly tolerance measured by a coordinate measuring machine, for each of a plurality of the units constituting the electron beam device, in a manner such that the electron beam passes through the center of at least one of a plurality of the lenses, a shift amount of the electron beam at a position of the at least one of the lenses, to determine an electrode condition for each of a plurality of the aligner electrodes included in the units in a manner such that a shift amount of the electron beam is to be the determined shift amount, and to set each of the aligner electrodes to the corresponding determined electrode condition.

Before describing the present embodiment, a method for adjusting the optical axis of an electron beam according to a comparative example will be described in order to clarify the problem according to the present embodiment.

COMPARATIVE EXAMPLE

Figure 6:
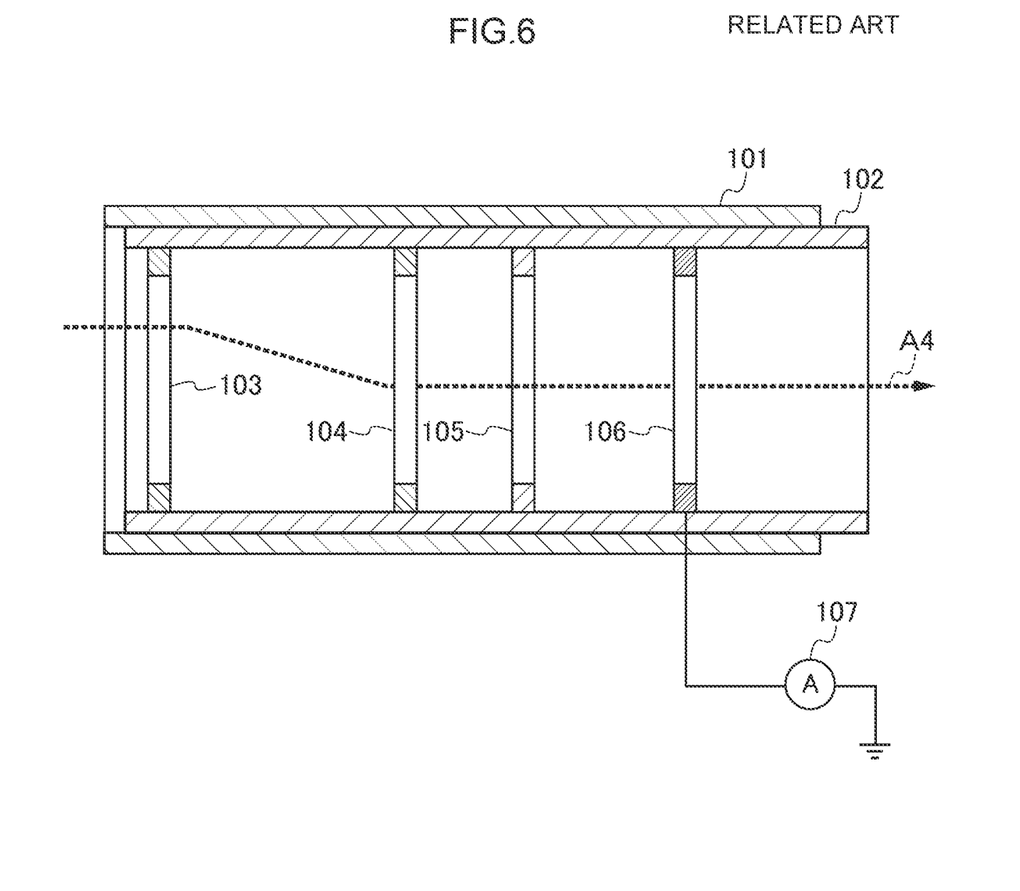
FIG. 6 is a schematic diagram showing a configuration of a part of an electron beam device according to a comparative example.

FIG. 6 is a schematic diagram showing a configuration of a part of an electron beam device according to a comparative example. As shown in FIG. 6, the electron beam device according to the comparative example includes a hollow cylindrical member 101, a hollow cylindrical member 102 fitted inside the cylindrical member 101, a first aligner electrode 103 fixed to the inner circumference of the cylindrical member 102, a second aligner electrode 104 fixed to the inner circumference of the cylindrical member 102, a lens 105, a current measurement aperture 106, and an ammeter 107 connected to the current measurement aperture 106.

By applying a voltage to the first aligner electrode 103 or the second aligner electrode 104, the trajectory of the electron beam can be changed. The lens 105 is an electrostatic lens or a magnetic lens. The ammeter 107 measures the current flowing through the current measurement aperture 106. The dashed arrow A4 indicates the path of the electron beam.

Figure 7:
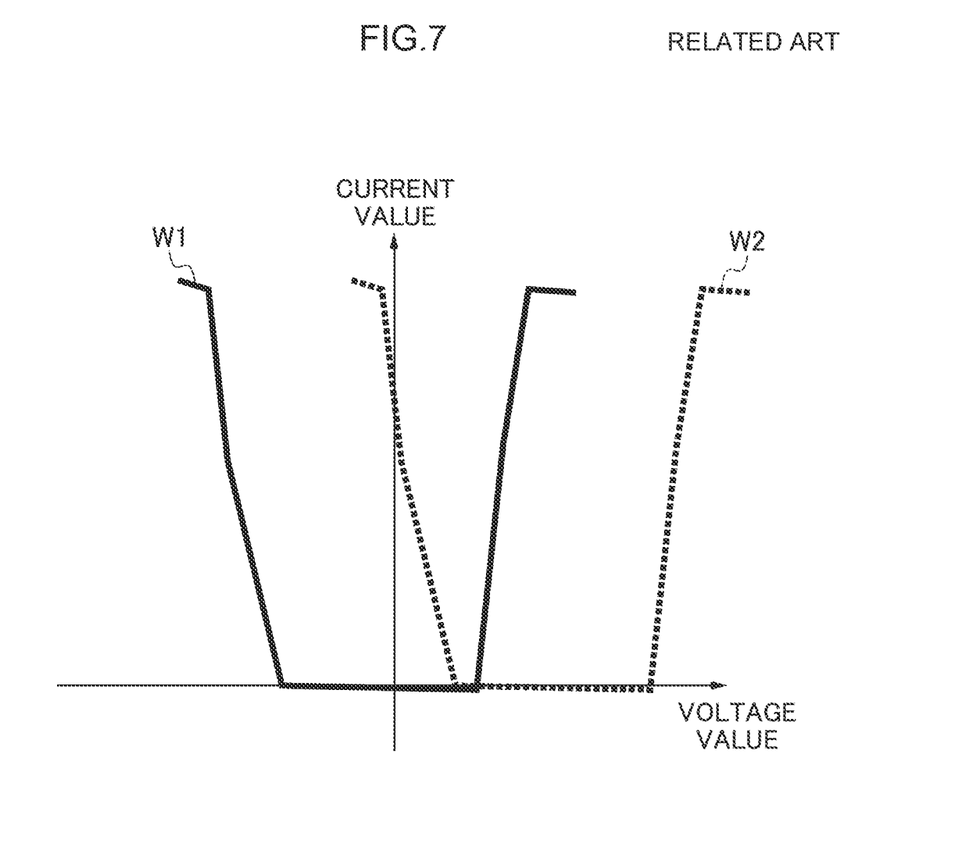
FIG. 7 is a graph showing a relation between the current value flowing through the current measurement aperture 106 and the voltage of the second aligner electrode 104 in the comparative example.

FIG. 7 is a graph showing a relation between the current value flowing through the current measurement aperture 106 and the voltage of the second aligner electrode 104 in the comparative example. In the graph of FIG. 7, the vertical axis represents the current value flowing through the current measurement aperture 106 measured by the ammeter 107, and the horizontal axis represents the voltage value of the second aligner electrode 104. FIG. 7 shows a curve W1 indicating the relation when the first aligner electrode 103 and the second aligner electrode 104 are used, and a curve W2 indicating the relation when the second aligner electrode 104 is only used.

In the adjustment of the optical axis of the electron beam according to the comparative example, an electron beam is actually emitted, and the axis is adjusted using information obtained thereby.

Specifically, first, the ammeter 107 measures the current flowing through the current measurement aperture 106, and the center of the electron beam is determined from the measured current profile. At this time, for example, the current value measured by the ammeter 107 is graphed as shown in FIG. 7.

Next, using an image electron beam obtained by imaging with a detector (for example, a camera such as a charge coupled device (CCD)), a change in the position of the image (spot) of the electron beam due to a change in the lens 105 is checked. Meanwhile, the voltages of the first aligner electrode 103 and the second aligner electrode 104 are adjusted so that the center position of the spot of the electron beam is not changed.

Figure 8:
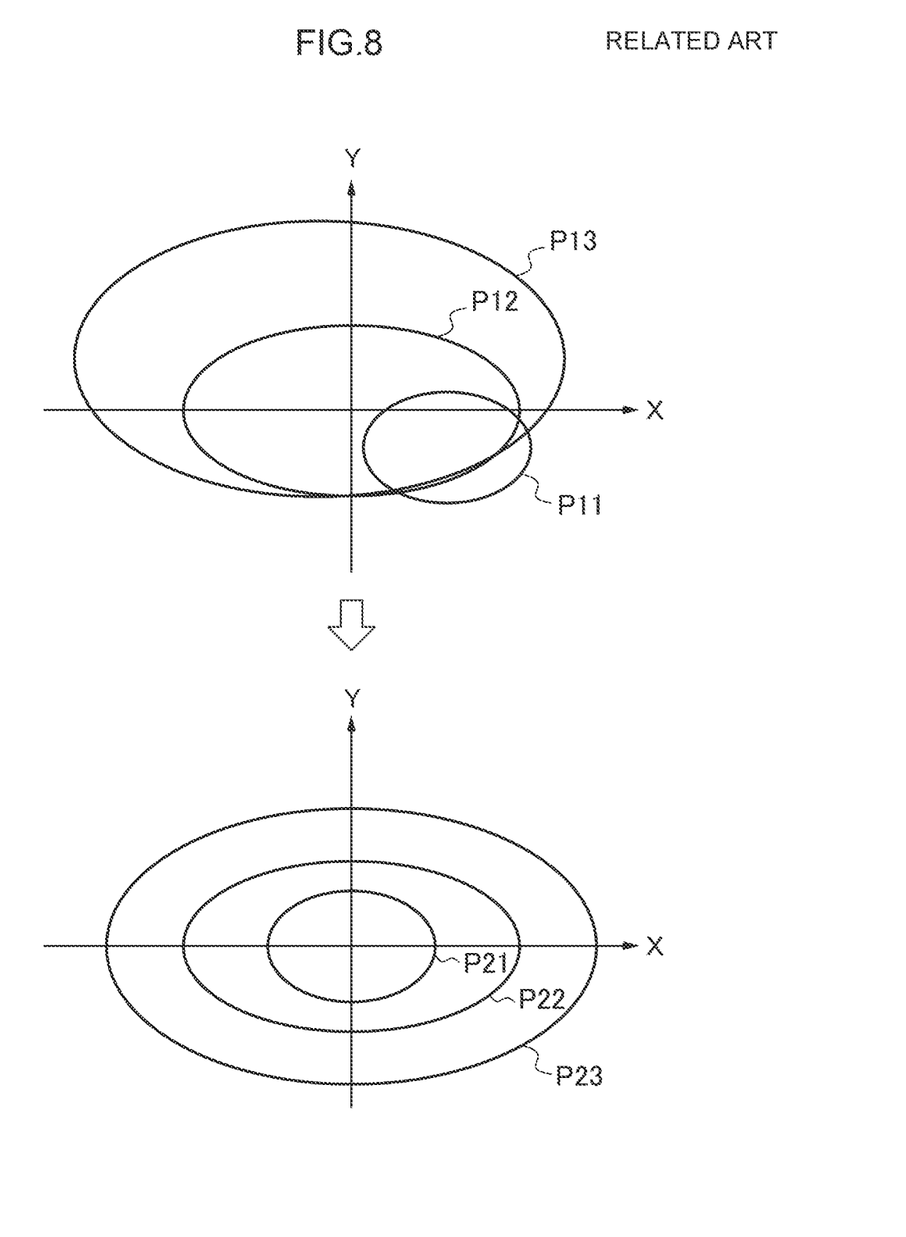
FIG. 8 is a diagram for comparing the spot position of the electron beam when the axis is shifted with the spot position of the electron beam after the axial shift is adjusted.

FIG. 8 is a diagram for comparing the spot position of the electron beam when the axis is shifted with the spot position of the electron beam after the axial shift is adjusted. The upper graph of FIG. 8 shows the spot position of the electron beam when the axis is shifted. As shown in the upper graph of FIG. 8, when the condition of the lens 105 is changed, the trajectory of the electron beam is changed when the axis is shifted, and the center positions of the electron beam spots P11 to P13 are changed.

On the other hand, the lower graph of FIG. 8 shows the spot position of the electron beam after the axial shift is adjusted. As shown in the lower graph of FIG. 8, the voltages of the first aligner electrode 103 and the second aligner electrode 104 are adjusted so that the center positions of the electron beam spots P21 to P23 are not changed although the condition of the lens 105 is changed. However, this adjustment is difficult and time-consuming. In contrast, the present embodiment facilitates the adjustment of the optical axis shift of the electron beam in the electron beam device.

<Present Embodiment>

Figure 1:
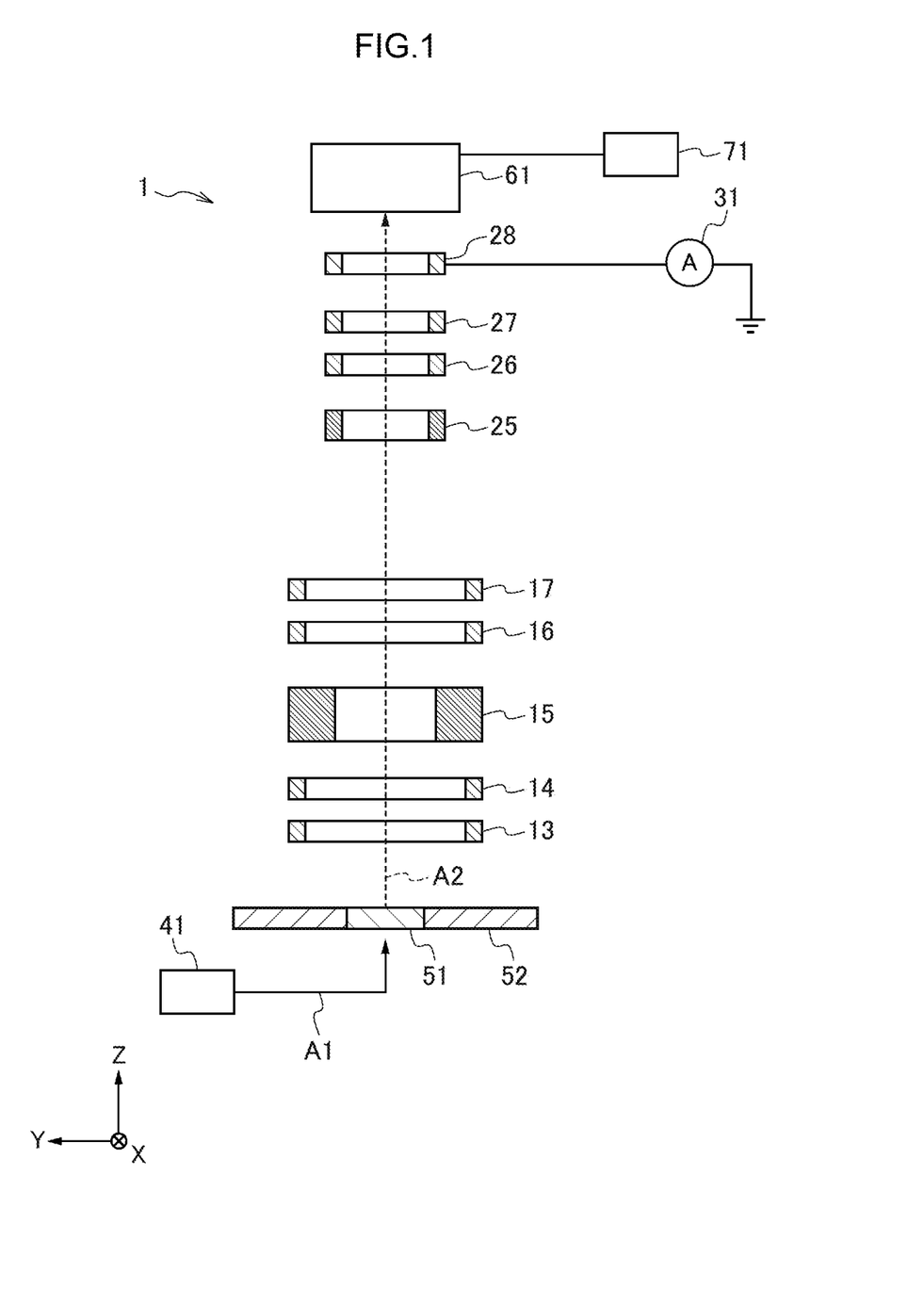
FIG. 1 is a diagram showing a schematic configuration of a secondary optical system of an electron beam device.

FIG. 1 is a diagram showing a schematic configuration of a secondary optical system of an electron beam device. As shown in FIG. 1, an electron beam device 1 includes an aligner electrode 13, an aligner electrode 14, a lens 15, an aligner electrode 16, an aligner electrode 17, a lens 25, an aligner electrode 26, an aligner electrode 27, a current measurement aperture 28, a detector 61, and a controller 71.

An ammeter 31 is connected to the current measurement aperture 28, and measures the current flowing through the current measurement aperture 28.

By applying a voltage to the aligner electrodes 13, 14, 16, 17, 26, and 27, the trajectory of an electron beam can be changed. The lenses 15, 25 are, for example, magnetic lenses. In order to adjust the optical axis of the electron beam, a photoelectronic member 51 is arranged on a support member 52 as shown in FIG. 1. Then, when a laser beam is emitted by a laser 41 from the back surface of the photoelectronic member 51 as shown by the arrow A1, an electron beam is emitted from the front surface of the photoelectronic member 51 as shown by the arrow A2.

The detector 61 is a means for detecting electrons guided by a secondary optical system. The detector 61 has a plurality of pixels on its surface. Various two-dimensional sensors can be applied to the detector 61. For example, a charge coupled device (CCD) and a time delay integration (TDI)-CCD may be applied to the detector 61. These are sensors that detect signals after converting electrons into light. Thus, a means for photoelectric conversion is required. Accordingly, electrons are converted into light by photoelectric conversion or a scintillator. The light image information is transmitted to the TDI that detects light. In this manner, electrons are detected. In the present embodiment, the detector 61 is assumed to be a CCD camera as an example. The controller 71 controls, for example, a voltage or current applied to the aligner electrodes 13, 14, 16, 17, 26, and 27. The controller 71 is connected to, for example, the detector 61 and can acquire a detection signal detected by the detector 61.

Figure 2A:
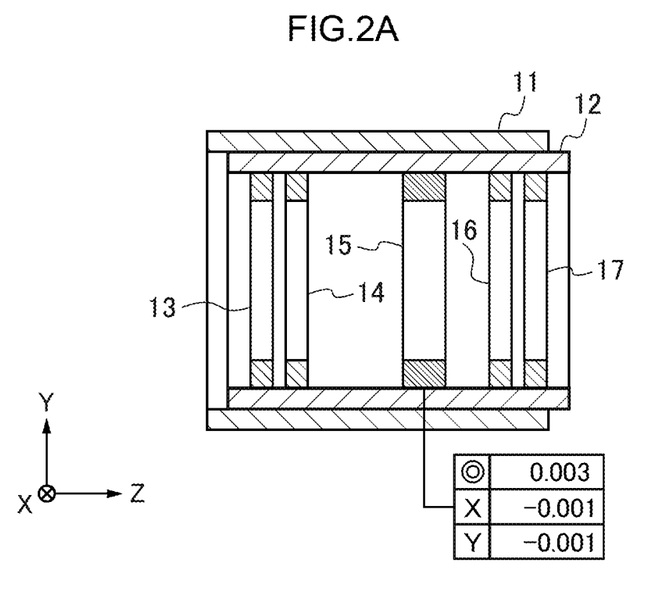
FIG. 2A is a diagram showing a schematic configuration of a first unit of the electron beam device.

FIG. 2A is a diagram showing a schematic configuration of a first unit of the electron beam device. The first unit includes a hollow cylindrical member 11, a hollow cylindrical member 12 fitted inside the cylindrical member 11, and aligner electrodes 13, 14, 16, and 17 fixed to the inner circumference of the cylindrical member 12, and a lens 105 fixed to the inner circumference of the cylindrical member 12.

Figure 2B:
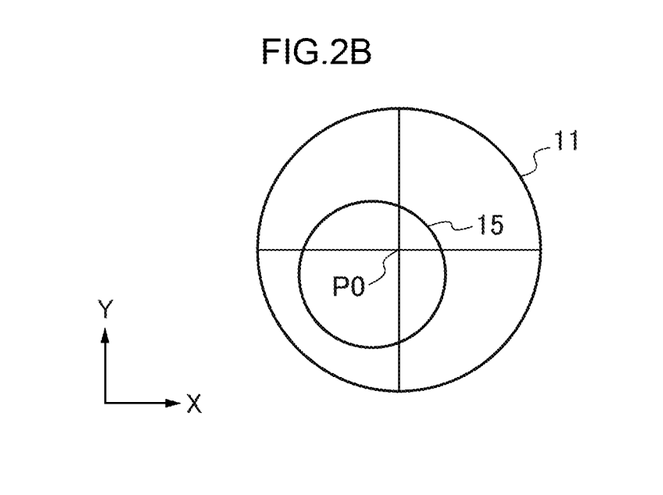
FIG. 2B is a diagram schematically showing an example of a positional relation between a cylindrical member and an inner edge of a lens.

In fitting the cylindrical member 12 into the cylindrical member 11, an assembly tolerance is generated. When this assembly tolerance is measured by a coordinate measuring machine, a shift amount is measured. The shift amount indicates how much the center of the lens 15 is shifted in the X direction and the Y direction from the center P0 of the cylindrical member 11. FIG. 2B is a diagram schematically showing the positional relation between the cylindrical member 11 and the inner edge of the lens 15 when the center of the lens 15 is shifted from the center P0 of the cylindrical member 11 by −0.001 mm in the X direction and by 0.001 mm in the Y direction, as shown in FIG. 2A. In this example case, the center of the lens 15 is shifted to the lower left from the center P0 of the cylindrical member 11 as shown in FIG. 2B. Thus, the trajectory of the electron beam needs to be adjusted so as to pass through the center of the lens 15.

Figure 3A:
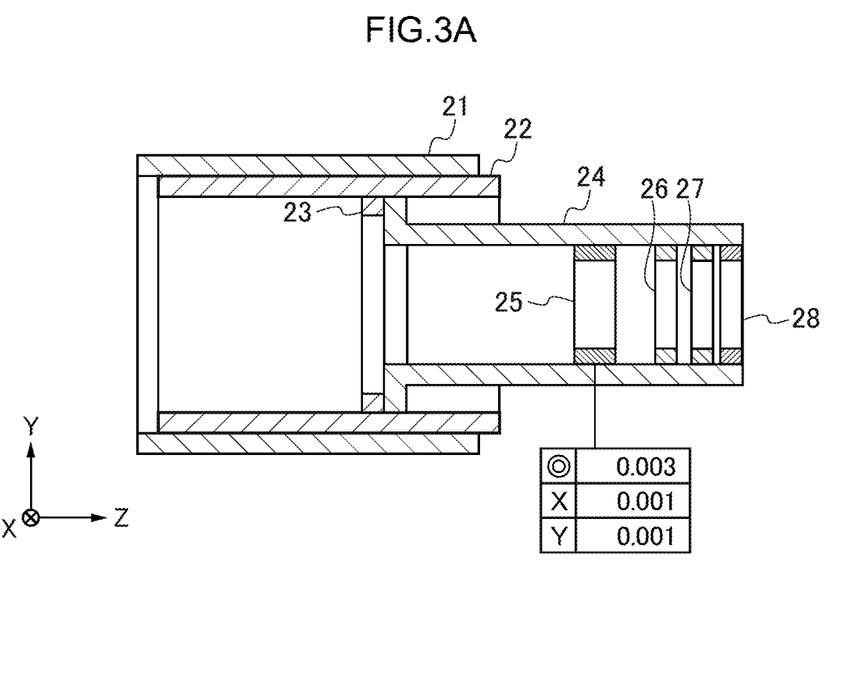
FIG. 3A is a diagram showing a schematic configuration of a second unit of the electron beam device.

FIG. 3A is a diagram showing a schematic configuration of a second unit of the electron beam device. The second unit includes a hollow cylindrical member 21, a hollow cylindrical member 22 fitted inside the cylindrical member 21, a positioning member 23 fixed to the inner circumference of the cylindrical member 22, a support member 24 coupled to the positioning member 23, a lens 25 fixed to the inner circumference of the support member 24, aligner electrodes 26 and 27 fixed to the inner circumference of the support member 24, and a current measurement aperture 28 fixed to the inner circumference of the support member 24.

Figure 3B:
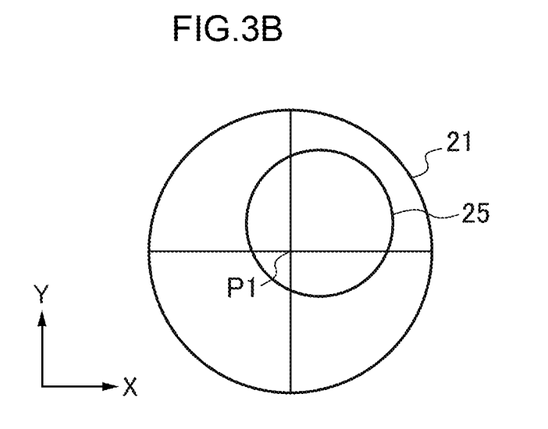
FIG. 3B is a diagram schematically showing a positional relation between a cylindrical member and an inner edge of a lens.

In fitting the cylindrical member 22 into the cylindrical member 21, fixing the positioning member 23 to the cylindrical member 22, and coupling the support member 24 to the positioning member 23, an assembly tolerance is generated. When this assembly tolerance is measured by a coordinate measuring machine, a shift amount indicating how much the center of the lens 25 is shifted in the X direction and the Y direction from the center P1 of the cylindrical member 21 is measured. FIG. 3B is a diagram showing the positional relation between the cylindrical member 21 and the inner edge of the lens 25 when the center of the lens 25 is shifted from the center P1 of the cylindrical member 21 by 0.001 mm in the X direction and by 0.001 mm in the Y direction, as shown in FIG. 3A. In this example case, the center of the lens 25 is shifted to the upper right with respect to the center P1 of the cylindrical member 21 as shown in FIG. 3B. Thus, the trajectory of the electron beam needs to be adjusted so as to pass through the center of the lens 25.

Figure 4:
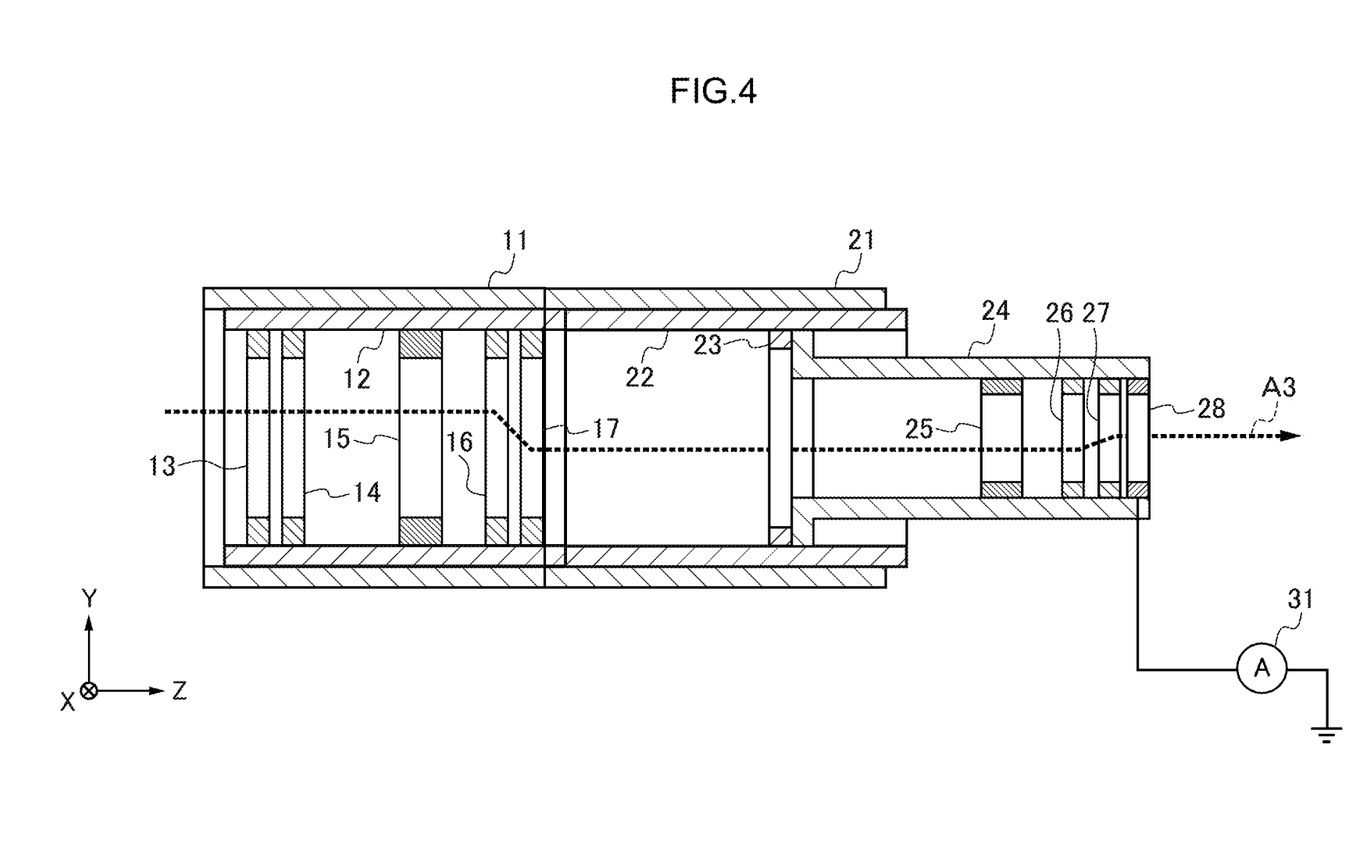
FIG. 4 is a diagram showing that the first unit and the second unit have been assembled.

FIG. 4 is a diagram showing that the first unit and the second unit have been assembled. The arrow A3 in FIG. 4 indicates the path of the electron beam passing through the center of the cylindrical member 11 and the center of the cylindrical member 21. In this manner, the path of the electron beam passing through the center of the cylindrical member 11 and the center of the cylindrical member 21 is simulated. Then, the voltage values of the aligner electrodes 13, 14, 16, 17, 26, and 27 are determined so as to achieve the path of the electron beam. Then, using an image of the electron beam obtained by imaging with the detector 61 similarly to the comparative example, a change in the position of the image (spot) of the electron beam due to a change in the lenses 15 and 25 is checked. Meanwhile, the voltage values of the aligner electrodes 13, 14, 16, 17, 26, and 27 are adjusted so that the center position of the spot of the electron beam is not changed.

Figure 5:
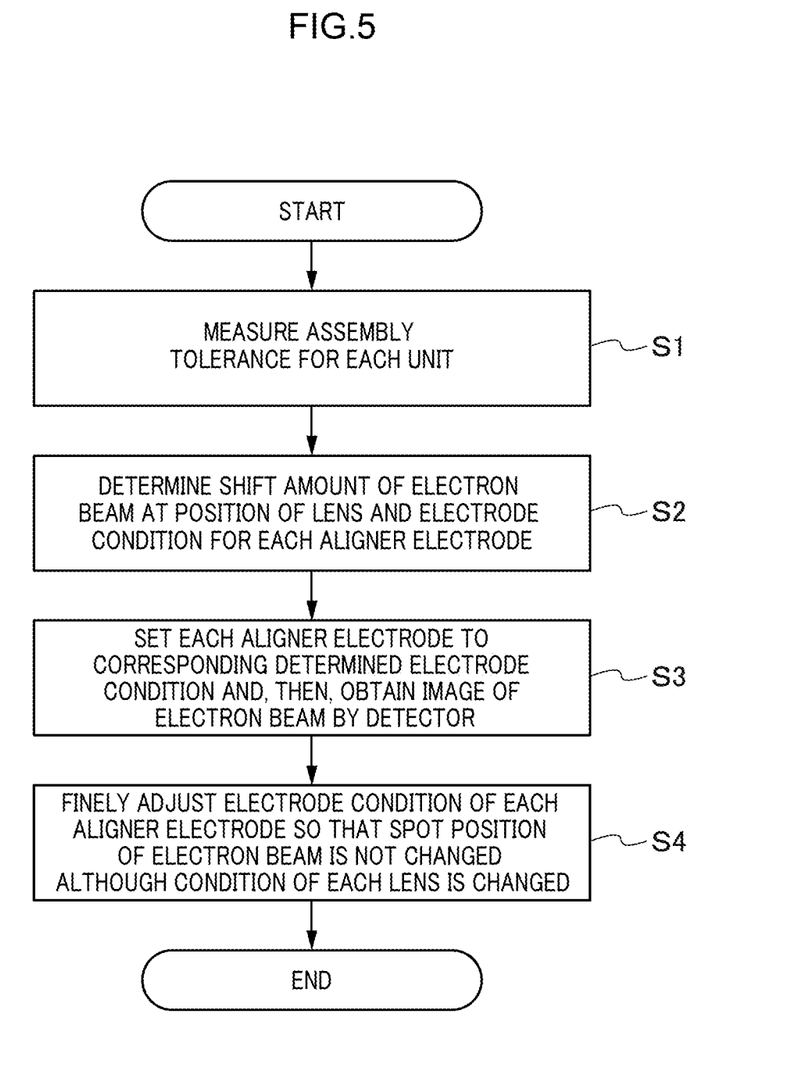
FIG. 5 is a flowchart showing an example of a procedure of a method for adjusting the path of the electron beam according to the present embodiment.

FIG. 5 is a flowchart showing an example of a procedure of a method for adjusting the path of the electron beam according to the present embodiment.

(Step S1) First, an assembly tolerance for each unit is measured by a coordinate measuring machine.

(Step S2) Next, the path of the electron beam is simulated so that the electron beam passes through the center of the lens 15 and the center of the lens 25. In other words, the shift amounts of the electron beam at the positions of the lens 15 and the lens 25 are determined so that the electron beam passes through the center of the lens 15 and the center of the lens 25. Here, since the shift amount with respect to a reference position is obtained as the assembly tolerance, which is the result of the measurement by the coordinate measuring machine, the shift amounts of the electron beam at the positions of the lens 15 and the lens 25 are determined using the value of the assembly tolerance. For example, in the case of FIG. 2A, since the center of the lens 15 is shifted by −0.001 mm in the X direction, the assembly tolerance is to be canceled by the shift amount of the electron beam in the X direction at the position of the lens 15 so that the electron beam can pass through the center of the lens 15. Based on this, the shift amount of the electron beam at the position of the lens 15 is determined. In the case of FIG. 2A, the shift amount of the electron beam in the X direction at the position of the lens 15 is +0.001 mm. Similarly, in the case of FIG. 2A, the shift amount of the electron beam in the Y direction at the position of the lens 15 is +0.001 mm.

Then, electrode conditions of the aligner electrodes 13, 14, 16, 17, 26, and 27 are determined so as to achieve the shift amount of the electron beam. Here, the electrode conditions are, for example, voltage values applied to the aligner electrodes when the aligner electrodes are electric field aligners, or the amount of the current flowing through coils included in magnetic field aligners when the aligner electrodes are the magnetic field aligners.

For example, when the number of stages of aligner electrodes to the lens 15 is one (for example, when only the aligner electrode 13 is arranged without the aligner electrode 14 in FIG. 2A), the electrode condition of the aligner electrode is determined in order for the electron beam to be shifted at the position of the lens by the determined shift amount.

The aligner electrodes include those using an electric field and those using a magnetic field, and the aligner electrodes 13, 14, 16, 17, 26, and 27 may be either. In the case of an electric field aligner, as described in Katsumi Ura (1994) "Electron and ion beam optics" Kyoritsu Shuppan Co., Ltd., page 6, when the distance between the target aligner electrode and the lens 15 is L, the shift amount $y_s$ of the electron beam in the Y direction at the position of the lens 15 (that is, the position separated from the aligner electrode by the distance L) is calculated by the following expression (1).

[Expression 1]

$$y_S = \frac{1}{d} \times L \times \frac{V_1}{V_0} \qquad (1)$$

Here, "l" represents the length of the aligner electrode in the Z direction (the length in the electron-beam trajectory direction), "d" represents the diameter of the aligner electrode (the length between the electrodes of the aligner electrode), "$V_1$" represents the voltage between the electrodes of the aligner electrode, and "$V_0$" represents the electron incident voltage (the acceleration voltage). Here, in the right-hand side of the expression (1), the values of l, d, L, and $V_0$ are predetermined in the design values, and the voltage $V_1$ between the electrodes of the aligner electrode is the only unknown value in the right-hand side of the expression (2). Thus, when the shift amount $y_s$ of the electron beam in the Y direction at the position of the lens 15 is determined, the voltage $V_1$ between the electrodes of the aligner electrode can be determined from the expression (1).

In this manner, the correspondence relation between the shift amount $y_s$ of the electron beam in the Y direction at the position of the lens 15 and the voltage $V_1$ between the electrodes of the aligner electrode is predetermined. Then, by applying the shift amount of the electron beam at the position of the lens 15 to the above correspondence relation, the voltage between the electrodes of the aligner electrode is determined as the electrode condition.

It has been assumed that, at the time of design, the distance between the target aligner electrode and the lens 15 (or the distance between the two aligner electrodes), the length of the aligner electrode, and the diameter of the aligner electrode are predetermined and cannot be changed. However, these parameters are not limited to the above. By making these parameters adjustable, a condition that satisfies, including these parameters, the desired shift amount may be calculated.

In the case of a magnetic field aligner, which is for example, a wound coil, the electron beam is assumed to pass through a magnetic field created using this coil. In this case, as described in Katsumi Ura (1994) "Electron and ion beam optics" Kyoritsu Shuppan Co., Ltd., page 9, when the distance between the target aligner electrode and the lens 15 is L, the shift amount $y_s$ of the electron beam in the Y direction at the position of the lens 15 (that is, the position separated from the aligner electrode by the distance L) is calculated by the following expression (2).

[Expression 2]

$$y_s = \sqrt{\frac{e}{2m}} \times \frac{B}{\sqrt{V_0}} \times 2 \times l \times L \qquad (2)$$

Here, "e" represents the elementary charge, "m" represents the weight of the electron, "B" represents the magnetic flux density in the negative direction of the X-axis (the direction from the back side to the front side of the sheet of FIG. 4), "$V_0$" represents the electron incident voltage (the acceleration voltage), "2×l" represents the length of the coil in the electron-beam passing direction (the length in the Z direction). Here, in the right-hand side of the expression (2), the values of e, m, $V_0$, l, and L are predetermined in the design values, and "B" is the only unknown value of the right-hand side of the expression (2).

When the coil is a circular finite length coil having n turns per unit length and when the current applied to the coil is I, the magnetic field strength B at the center of the coil is expressed by the following expression.

$$B = \mu \times n \times I \qquad (3)$$

Here, since the magnetic permeability μ and the number of turns n per unit length of a material provided at the center of the coil (for example, an iron core) are predetermined, when the shift amount $y_s$ of the electron beam in the Y direction at the position of the lens 15 is determined, the current I passing through the coil can be determined from the expressions (2) and (3).

In this manner, the correspondence relation between the shift amount $y_s$ of the electron beam in the Y direction at the position of the lens 15 and the current applied to the aligner electrode is predetermined. Then, by applying the shift amount of the electron beam at the position of the lens 15 to the corresponding relation, the current applied to the aligner electrode is determined as the electrode condition.

It has been assumed that, at the time of design, the distance between the target aligner electrode and the lens 15 (or the distance between the two aligner electrodes), the length of the coil in the electron-beam passing direction, the number of turns n per unit length (or the total number of turns) are predetermined and cannot be changed. However, these parameters are not limited to the above. By making these parameters adjustable, a condition that satisfies, including these parameters, the desired shift amount may be calculated.

(Step S3) Next, the aligner electrodes 13, 14, 16, 17, 26, and 27 are set to the respective determined electrode conditions, and, then, the detector 61 performs imaging to obtain an image of the electron beam.

(Step S4) The voltage values of the aligner electrodes 13, 14, 16, 17, 26, and 27 are finely adjusted so that the spot position of the electron beam is not changed although the condition of each of the lenses 15 and 25 is changed.

In the present embodiment, the number of units has been described as two, but may be one, or three or more.

The unit is only required to have at least one lens and at least one aligner electrode, and it is sufficient that at least one such unit is provided.

Furthermore, in the present embodiment, the path of the electron beam has been simulated so as to pass through the center of the lens 15 and the center of the lens 25. However, the path of the electron beam is not limited to this, and may be simulated so as to pass through only one of the centers, and is only required to be simulated so as to pass through the center of at least one lens.

As described above, the adjustment method according to the present embodiment is an adjustment method for adjusting a path of an electron beam passing through an electron beam device including at least one unit having at least one lens and at least one aligner electrode, and a detector 61 that detects the electron beam, the adjustment method having a step of measuring, by a coordinate measuring machine, an assembly tolerance for each of a plurality of the units constituting the electron beam device, a step of determining, in consideration of the assembly tolerance for each of the units in a manner such that the electron beam passes through the center of at least one of a lens 15 and a lens 25, a shift amount of the electron beam at a position of the lens 15 or the lens 25, a step of determining an electrode condition for each of aligner electrodes 13, 14, 16, 17, 26, and 27 included in the units in a manner such that a shift amount of the electron beam is to be the determined shift amount, and a step of setting each of the aligner electrodes to the corresponding determined electrode condition.

With this configuration, the electrode conditions of the aligner electrodes (for example, the voltage values) are mostly adjusted by determining the electrode condition for each of the aligner electrodes (for example, a voltage value) included in the units in a manner such that a path of the electron beam is to be the simulated path, and fine manual adjustment is only required. Thus, it is possible to facilitate the adjustment of the optical axis shift of the electron beam in the electron beam device.

The adjustment method according to the present embodiment further has a step of adjusting, after the setting each of the aligner electrodes 13, 14, 16, 17, 26, and 27 to the corresponding determined electrode condition, the voltage of each of the aligner electrodes 13, 14, 16, 17, 26, and 27 in a manner such that an image of the electron beam obtained by the detector 61 is not changed although a condition of each of the lens 15 and the lens 25 is changed. This completes the adjustment of the optical axis shift of the electron beam in the electron beam device. Note that, this step of adjusting may be unnecessary depending on an electron beam device, and can be omitted.

In this embodiment, the step of determining the shift amount of the electron beam, the step of determining the electrode condition, the step of setting each of the aligner electrodes to the corresponding electrode condition, and the step of adjusting the voltage of each of the aligner electrodes have been performed manually. However, a controller 71 of the electron beam device may execute these steps.

That is, the controller 71 may perform control to determine, in consideration of an assembly tolerance, which is measured by a coordinate measuring machine, for each of a plurality of the units constituting the electron beam device, in a manner such that the electron beam passes through the center of at least one of a lens 15 and a lens 25, a shift amounts of the electron beam at a position of the lens 15 or the lens 25, to determine an electrode condition for each of aligner electrodes 13, 14, 16, 17, 26, and 27 included in the units in a manner such that a shift amount of the electron beam is to be the determined shift amount, and to set each of the aligner electrodes 13, 14, 16, 17, 26, and 27 to the corresponding determined electrode condition.

The controller 71 may further perform control to adjust, after the setting each of the aligner electrodes 13, 14, 16, 17, 26, and 27 to the corresponding determined electrode condition, the voltage of each of the aligner electrodes 13, 14, 16, 17, 26, and 27 in a manner such that an image of the electron beam obtained by the detector 61 is not changed although a condition of each of the lens 15 and the lens 25 is changed.

The present technique is not limited to the above embodiment as it is, and can be embodied by modifying the constituent elements in the practical stage without departing from the scope of the invention. In addition, various techniques can be achieved by appropriately combining the constituent elements disclosed in the embodiment. For example, some constituent elements may be deleted from all the constituent elements described in the embodiment. Furthermore, constituent elements in different embodiments may be appropriately combined.

REFERENCE SIGNS LIST

1 Electron beam device
101 Cylindrical member
102 Cylindrical member
103 First aligner electrode
104 Second aligner electrode
105 Lens
106 Current measurement aperture
107 Ammeter
11 Cylindrical member
12 Cylindrical member
13, 14, 16, 17 Aligner electrode
15 Lens
21 Cylindrical member
22 Cylindrical member
23 Positioning member
24 Support member
25 Lens
26, 27 Aligner electrode
28 Current measurement aperture
31 Ammeter
41 Laser
51 Photoelectronic member
52 Support member
61 Detector
71 Controller

What is claimed is:

1. An adjustment method for adjusting a path of an electron beam passing through an electron beam device including at least one unit having at least one lens and at least one aligner electrode, and a detector configured to detect the electron beam, the method comprising:
    a step of measuring, by a coordinate measuring machine, an assembly tolerance for each of a plurality of the units constituting the electron beam device;
    a step of determining, in consideration of the assembly tolerance for each of the units in a manner such that the electron beam passes through the center of at least one of a plurality of the lenses, a shift amount of the electron beam at a position of the at least one of the lenses;
    a step of determining an electrode condition for each of a plurality of the aligner electrodes included in the units in a manner such that a shift amount of the electron beam is to be the determined shift amount; and
    a step of setting each of the aligner electrodes to the corresponding determined electrode condition.

2. The adjustment method according to claim 1, further comprising a step of adjusting, after the setting each of the aligner electrodes to the corresponding determined electrode condition, the corresponding electrode condition for each of the aligner electrodes in a manner such that an image of the electron beam obtained by the detector is not changed although a condition for each of the lenses is changed.

3. The adjustment method according to claim 1, wherein
    when the aligner electrode is an electric field aligner, a correspondence relation between the shift amount of the electron beam at the position of the at least one of the lenses and a voltage between electrodes of the aligner electrode is predetermined, and
    in the step of determining the electrode condition, by applying the shift amount of the electron beam at the position of the lens to the correspondence relation, the voltage between the electrodes of the aligner electrode is determined as the electrode condition.

4. The adjustment method according to claim 1, wherein
    when the aligner electrode is a magnetic field aligner, a correspondence relation between the shift amount of the electron beam at the position of the at least one of the lenses and a current applied to the aligner electrode is predetermined, and
    in the step of determining the electrode condition, by applying the shift amount of the electron beam at the position of the lens to the correspondence relation, the current applied to the aligner electrode is determined as the electrode condition.

5. An electron beam device comprising:
    at least one unit having at least one lens and at least one aligner electrode;
    a detector configured to detect an electron beam; and
    a controller configured to perform control to determine, in consideration of an assembly tolerance, the assembly tolerance measured by a coordinate measuring machine, for each of a plurality of the units constituting the electron beam device, in a manner such that the electron beam passes through the center of at least one of a plurality of the lenses, a shift amount of the electron beam at a position of the at least one of the lenses, to determine an electrode condition for each of a plurality of the aligner electrodes included in the units in a manner such that a shift amount of the electron beam is to be the determined shift amount, and to set each of the aligner electrodes to the corresponding determined electrode condition.

* * * * *